(12) United States Patent
Goodman et al.

(10) Patent No.: US 9,515,698 B2
(45) Date of Patent: *Dec. 6, 2016

(54) ULTRA-WIDEBAND FREQUENCY POSITION MODULATION USING NONLINEAR COMPRESSED SENSING

(71) Applicant: The United States of America, as represented by the Secretary of the Navy, Washington, DC (US)

(72) Inventors: Joel I. Goodman, Alexandria, VA (US); Crystal Bertoncini Acosta, Alexandria, VA (US); Gregory Cowart, Upper Marlboro, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/961,162

(22) Filed: Dec. 7, 2015

(65) Prior Publication Data
US 2016/0087674 A1    Mar. 24, 2016

Related U.S. Application Data

(63) Continuation of application No. 14/217,398, filed on Mar. 17, 2014, now Pat. No. 9,209,861.
(Continued)

(51) Int. Cl.
*H04B 1/715* (2011.01)
*H03F 1/32* (2006.01)
(Continued)

(52) U.S. Cl.
CPC ............... *H04B 1/715* (2013.01); *H03F 1/32* (2013.01); *H04B 1/04* (2013.01); *H04L 5/14* (2013.01);
(Continued)

(58) Field of Classification Search
CPC ........ H03F 1/32; H04L 25/03993; H04L 5/02; H04L 5/14; G01R 23/20
See application file for complete search history.

(56) References Cited

U.S. PATENT DOCUMENTS

| 7,283,231 B2 | 10/2007 | Brady et al. |
| 7,427,932 B2 | 9/2008 | Brady et al. |

(Continued)

OTHER PUBLICATIONS

Baraniuk, R.G., "Compressive Sensing," IEEE Signal Process. Mag., vol. 24, pp. 18-124 (Jul. 2007).
(Continued)

*Primary Examiner* — Daniel Washburn
*Assistant Examiner* — Eboni Hughes
(74) *Attorney, Agent, or Firm* — US Naval Research Laboratory; Sally A. Ferrett

(57) ABSTRACT

A Frequency Position Modulation system for encoding signals for transmission. A signal's discrete frequency support is used to represent symbols. The signal can be non-uniformly spread over many GHz of instantaneous bandwidth, resulting in a communications system that is resilient to interference and difficult to intercept. The FPM symbols are recovered using adaptive projections that use an analog polynomial nonlinearity paired with an analog-to-digital converter that is sampling at a rate at that is only a fraction of the instantaneous bandwidth of the signal. In the presence of partial band interference, nonlinearities generated by the transmitter are exploited by the receiver to help unambiguously recover tones that could otherwise be lost. The nonlinearities are generated by driving the power amplifier of the transmitter into saturation to induce distortions at a desired level.

8 Claims, 8 Drawing Sheets

Related U.S. Application Data

(60) Provisional application No. 61/789,464, filed on Mar. 15, 2013.

(51) Int. Cl.
  *H04L 25/03* (2006.01)
  *H04L 5/14* (2006.01)
  *H04B 1/04* (2006.01)
  *H04L 5/02* (2006.01)

(52) U.S. Cl.
  CPC . *H04L 25/03993* (2013.01); *H04B 2001/0408* (2013.01); *H04L 5/02* (2013.01)

(56) References Cited

U.S. PATENT DOCUMENTS

| | | | |
|---|---|---|---|
| 7,432,843 B2 | 10/2008 | Brady et al. | |
| 7,463,174 B2 | 12/2008 | Brady et al. | |
| 7,616,306 B2 | 11/2009 | Brady et al. | |
| 7,808,315 B2 | 10/2010 | Goodman et al. | |
| 7,928,893 B2 | 4/2011 | Baraniuk et al. | |
| 8,810,404 B2 | 8/2014 | Bertoncini et al. | |
| 2007/0069739 A1* | 3/2007 | Quan | 324/622 |
| 2010/0141269 A1* | 6/2010 | Quan | 324/622 |
| 2014/0254812 A1* | 9/2014 | Quan | 381/58 |

OTHER PUBLICATIONS

Bucholtz, F.; Urick, V.J.; Godinez, M.; Williams, K.J.; "Graphical Approach for Evaluating Performance Limitations in Externally Modulated Analog Photonic Links," IEEE Transactions on Microwave Theory and Techniques, vol. 56, No. 1, pp. 242-247, (Jan. 2008).

Candes, E.J. and Tao,T., "Decoding by Linear Programming," IEEE Trans. Inf. Theory, vol. 51, No. 12, pp. 4203-4215, (Dec. 2005).

Candes, E.J., Romberg, J., and Tao, T., "Robust uncertainty principles: exact signal reconstruction from highly incomplete frequency information," IEEE Trans. Inf. Theory, vol. 52, No. 2, pp. 489-509, (Feb. 2006).

Candes, E. and Wakin, M.B., "An introduction to compressive sampling," IEEE Signal Processing Magazine, vol. 8, pp. 21-30 (Mar. 2008).

Chan, W.L., et al., "A single-pixel terahertz imaging system based on compressed sensing," Appl. Phys. Lett., vol. 93, pp. 121105-1-121105-3, Sep. 22, 2008.

Chen, S.S., Donoho, D.L., Saunders, M.A., "Atomic decomposition by basis pursuit" , SIAM Journal on Scientific Computing, vol. 43, Issue 1, pp. 129-159, 2001.

Donoho, D.L., "Compressed Sensing," IEEE Trans. Inf. Theory, vol. 52, No. 4, pp. 1289-1306 (Apr. 2006).

Duarte, M.F., et al., "Single-pixel Imaging via Compressive Sampling," IEEE Signal Process. Mag., vol. 25, No. 2, pp. 83-91 (Mar. 2008).

Figueiredo, M.A.T., et al., "Gradient Projection for Sparse Reconstruction: Application to Compressed Sensing and Other Inverse Problems," IEEE J. Sel. Top. Signal Process., vol. 1, No. 4, pp. 586-597 (Dec. 2007).

Forsythe, K.W.; Goodman, J.I.; Green, M.R.; Miller, B.A.; Raz, G.M.; Jackson, J.H.; "Analog to Information Study Phase Final Report", MIT Lincoln Laboratory, Oct. 2007, pp. 1-101.

Gazit, S., et al., "Super-resolution and reconstruction of sparse sub-wavelength images," Opt. Express, vol. 17, No. 26, pp. 23920-23946, Dec. 16, 2009.

Goodman, J.I.; Miller, B.; Raz, G.; Jackson, J.; "A Polyphase Nonlinear Equalization of Time-Interleaved Analog-to-Digital Converters", IEEE Journal of Selected Topics in Signal Processing, vol. 3, Issue 3, Jun. 3, 2009, pp. 593-597.

Goodman, J.; Forsythe, K.; Miller, B.; "Efficient Reconstruction of Block Sparse Signals", IEEE Statistical Signal Processing Workshop (SSP), Jun. 28-30, 2011, p. 629-632.

Goodman, J.; Miller, B.; Raz, G.; Bolstad, A.; "Variable Projection and Unfolding in Compressed Sensing", IEEE SSP 2007, pp. 358-362, (2007).

Goodman, J.I.; Macdonald, T.G.; "Communications Applications", in "High Performance Embedded Computing Handbook: A Systems Perspective", M.M. Vai, R.A. Bond, D.R. Martinez, editors, Chapter 30, pp. 425-436, 2008.

Goodman, J.; Miller, B.; Herman, M.; Vai, M.; Monticciolo, P.; "Extending the dynamic range of RF receivers using nonlinear equalization"; International Waveform Diversity and Design Conference, 2009; Feb. 8-13, 2009; pp. 224-228.

Herman, M.; Miller, B.; Goodman, J., "The Cube Coefficient Subspace Architecture for Nonlinear Digital Projection", IEEE Asilomar 2008, pp. 1857-1861, (2008).

Herman, M.; Miller, B. Goodman, J.; "Efficient Multidimensional Polynomial Filtering for Nonlinear Digital Predistortion", HPEC Workshop 2008, Sep. 2008, pp. 1-4.

Ji S., Xue, Y., and Carin,L., "Bayesian compressive sensing," IEEE Trans. Signal Processing, vol. 56, No. 6, pp. 2346-2356, Jun. 2008.

Miller, B.A.; Goodman, J.I.; Forsythe, K.; Sun, J.Z.; Goyal, V.K.; "A Multi-Sensor Compressed Sensing Receiver: Performance Bounds and Simulated Results", The Forty Third Asilomar Conference on Signals, Systems and Computers, Nov. 2009, pp. 1571-1575.

Miller, B.; Goodman, J.; Forsythe, K.; "Compressed Sensing Arrays for Frequency-Sparse Signal Detection and Geolocation", 2009 DoD High Performance Computing Modernization Program Users Conference, IEEE, pp. 297-301, (2009).

Katz, O., et al., "Compressive ghost imaging," Appl. Phys. Lett., vol. 95, pp. 131110-1-131110-3 (Sep. 28, 2009).

Luo, C., Médard, M., and Zheng, L., "On approaching wideband capacity using multitone FSK," IEEE Transactions on Selected Areas in Communications, vol. 23, pp. 1830-1838, 2005.

Mishali, M., and Eldar, Y.C., "Xampling: Analog Data Compression," IEEE Computer Society, Proceedings of the 2010 Data Compression Conference (DCC), pp. 366-375, conference date Mar. 24-26, 2010.

Mishali, M., and Eldar, Y.C., "From Theory to Practice: Sub-Nyquist Sampling of Sparse Wideband Analog Signals, "IEEE Journal of Selected Topics in Signal Processing, vol. 4, No. 2, pp. 375-391, Apr. 2010.

Nan, H., et al., "Optical Analog-to-Digital Conversion System Based on Compressive Sampling," Photonics Technology Letters, IEEE , vol. 23, No. 2, pp. 67-69, Jan. 15, 2011.

Nichols, J.M.; Currie, M., Bucholtz, F., and Link, W.A., "Bayesian Estimation of Weak Material Dispersion: Theory and Experiment," Opt. Express, vol. 18, No. 3, pp. 2076-2089 (Jan. 19, 2010).

Nichols, J.M.; McLaughlin, C.; Bucholtz, F.; "Characterization of a compressively sampled photonic link," Avionics, Fiber-Optics and Photonics Technology Conference (AVFOP), 2011 IEEE, pp. 33-34, Oct. 4-6, 2011.

Nichols, J., McLaughlin, C., Bucholtz, F., and Michalowicz, J., "Characterization of a compressively sampled photonic link," Appl. Opt., vol. 51, pp. 6448-6456 (Sep. 2012).

Pedro, J.C.; Maas, S.A.; "A Comparative Overview of Microwave and Wireless Power-Amplifier Behavioral Modeling Approaches", IEEE Transactions on Microwave theory and Techniques, vol. 53, No. 4, Apr. 2005, pp. 1150-1163.

Romberg, J., "Imaging Via Compressive Sampling," IEEE Signal Process. Mag. vol. 25, No. 2, pp. 14-20 (Mar. 2008).

Rudin, L.I., et al., "Nonlinear total variation based noise removal algorithms", Proceedings of the eleventh annual international conference of the Center for Nonlinear Studies on Experimental mathematics: computational issues in nonlinear science; Physica D., vol. 60, Issue 1-4, pp. 259-268, Nov. 1992.

Tropp, J.A., et al., "Beyond Nyquist: Efficient Sampling of Sparse Bandlimited Signals," IEEE Trans. Inf. Theory, vol. 56, No. 1, pp. 520-544 (Jan. 2010).

Tropp, J.A., Gilbert, A.C., "Signal Recovery From Random Measurements Via Orthogonal Matching Pursuit", IEEE Transactions on Information Theory, vol. 53, No. 12, pp. 4655-4666, Dec. 2007.

(56) References Cited

OTHER PUBLICATIONS

Yang, D., et al., "Compressed Sensing Based UWB Receiver: Hardware Compressing and FPGA Reconstruction," Proceedings of the 43rd Conference on Information Sciences and Systems (CISS), p. 198-201, conference date Mar. 18-20, 2009.

* cited by examiner

ULTRA-WIDEBAND FREQUENCY POSITION MODULATION USING NONLINEAR COMPRESSED SENSING

CROSS-REFERENCE TO RELATED APPLICATIONS

This Application is a continuation of U.S. patent application Ser. No. 14/217,398, filed on Mar. 17, 2014, which is a non-provisional under 35 USC 119(e) of, and claims the benefit of, U.S. Provisional Application filed on Mar. 15, 2013, the disclosures of each of which are incorporated herein in their entirety.

BACKGROUND

1. Technical Field

This application is related to the field of digital communication, and more particularly, to digital modulation, transmitters, and receivers.

2. Background Technology

Low probability of intercept (LPI) and low probability of detection (LPD) communications employing frequency-hopping code division multiple access (FH-CDMA) and direct-sequence code division multiple access (DS-CDMA) are the most common form of LPI/LPD modulation, with uses in both tactical and commercial applications.

DS-CDMA adds redundancy by spreading the instantaneous bandwidth of the signal, effectively trading data-rate and spectral efficiency for processing gain. There is, however, a limit to the achievable spreading bandwidth, as the information-theoretic capacity starts decreasing towards zero with increasing bandwidth in frequency selective fading.

Multi-tone frequency shift keying (MT-FSK) can approach the information-theoretic capacity in frequency selective fading with increasing bandwidth. Further, by operating over a very wide bandwidth, MT-FSK encoded signals are more difficult to intercept and/or detect. However, detecting these tones in potentially crowded spectral environment requires a receiver capable of operating over a very wide instantaneous bandwidth. Because of practical limitations on the instantaneous bandwidth over which any single receiver can operate, many systems include multiple receivers, negatively affecting cost, size, weight, and power requirements.

Candes, E. and Wakin, M., "An introduction to compressive sampling," IEEE Signal Processing Magazine, Vol. 8, pp. 21-30 (2008) discloses an electronic compressed sensing receiver that is intended to extend the instantaneous bandwidth by random sampling. However, this approach is believed to be ill-suited for commercial off-the-shelf analog-to-digital converters, whose sample-and-hold circuitry is generally very well matched to the maximum sample rate, such that oversampling will lead to signal attenuation beyond the Nyquist rate.

Compressed sensing receivers and methods are also discussed in J. I. Goodman, et al, "Polyphase Nonlinear Equalization of Time-Interleaved Analog-to-Digital Converters", *IEEE Journal of Selected Topics in Signal Processing*, Vol. 3, Issue 3, June 2009; B. A. Miller, J. I. Goodman et al, "A Multi-Sensor Compressed Sensing Receiver: Performance Bounds and Simulated Results" "*The Forty Third Asilomar Conference on Signals, Systems and Computes*", November 2009; and J. I. Goodman, K. W. Forsythe, B. A. Miller, "Efficient Reconstruction of Block Sparse Signals", *IEEE Statistical Signal Processing Workshop*, June 2011, pp. 629-632.

Various digital modulation formats, as well as transmission and receiving systems, are described in J. I. Goodman, T. G. Macdonald, "Communications Applications", in "High Performance Embedded Computing Handbook: A Systems Perspective", M. M. Vai, R. A. Bond, D. R. Martinez, editors, Chapter 30, pp. 425-436, 2008.

BRIEF SUMMARY

An aspect of the invention is a method and system for modulating a digital signal for transmission, including generating a plurality of tones, each tone being centered at a different frequency, and generating at least second and third order intermodulation terms by driving the plurality of tones through a power amplifier at a power level that drives the power amplifier into saturation, said tones and said second and third order intermodulation terms being the elements of a frequency position modulation constellation.

The symbol to be transmitted can be written as $$s(t) = \underbrace{\left(\sum_{\omega_m \in U_k} \cos(\omega_m t)\right)}_{\hat{s}(t)} + \sum_{p=1}^{P} g_p(\hat{s}(t))$$

for $0 \leq t < T_s$, wherein the nonlinearity-generated intermodulation terms are defined by $g_p(\hat{s}(t))$ according to $$\sum_{p=1}^{P} g_p(\hat{s}(t)) = \sum_{p=1}^{P} \int_{\tau_1} \ldots \int_{\tau_p} h(\tau_1, \ldots, \tau_p) \prod_{i=1}^{p} \hat{s}(t-\tau_i) d\tau_1 \ldots d\tau_p,$$

where $h(\tau_1, \ldots, \tau_p)$ is the multidimensional system response of the transmitter.

The method and system can also include receiving a transmitted signal, and filtering and mixing the signal down to baseband according to $$y(t) = \underbrace{\left((h_{CMB}(t) * s(t)) \sum_{\omega_n \in U_{LO}} \cos(\omega_n t)\right)}_{multi-spectral\ projections} * h_{AA}(t) + n(t)$$

using multiple local oscillator frequencies $\omega_n \in U_{LO}$ with $U_{LO}$ being defined by $$U_{LO} = \bigcup_{i=1}^{\frac{N_{pos}}{2}} \omega_L + \frac{BW}{N_{pos}}(2i-1),$$

where the bandwidth BW is the contiguous bandwidth over which FPM symbols are transmitted, $\omega_L$ is the lowest transmitted frequency within the bandwidth BW, $h_{AA}(t)$ is an anti-aliasing filter that precedes an analog-to-digital converter, and * represents the convolution operator.

in a Npos=4 FPM system by mixing with tones in the receiver at locations defined by $U_{LO}$.

Figure 3:
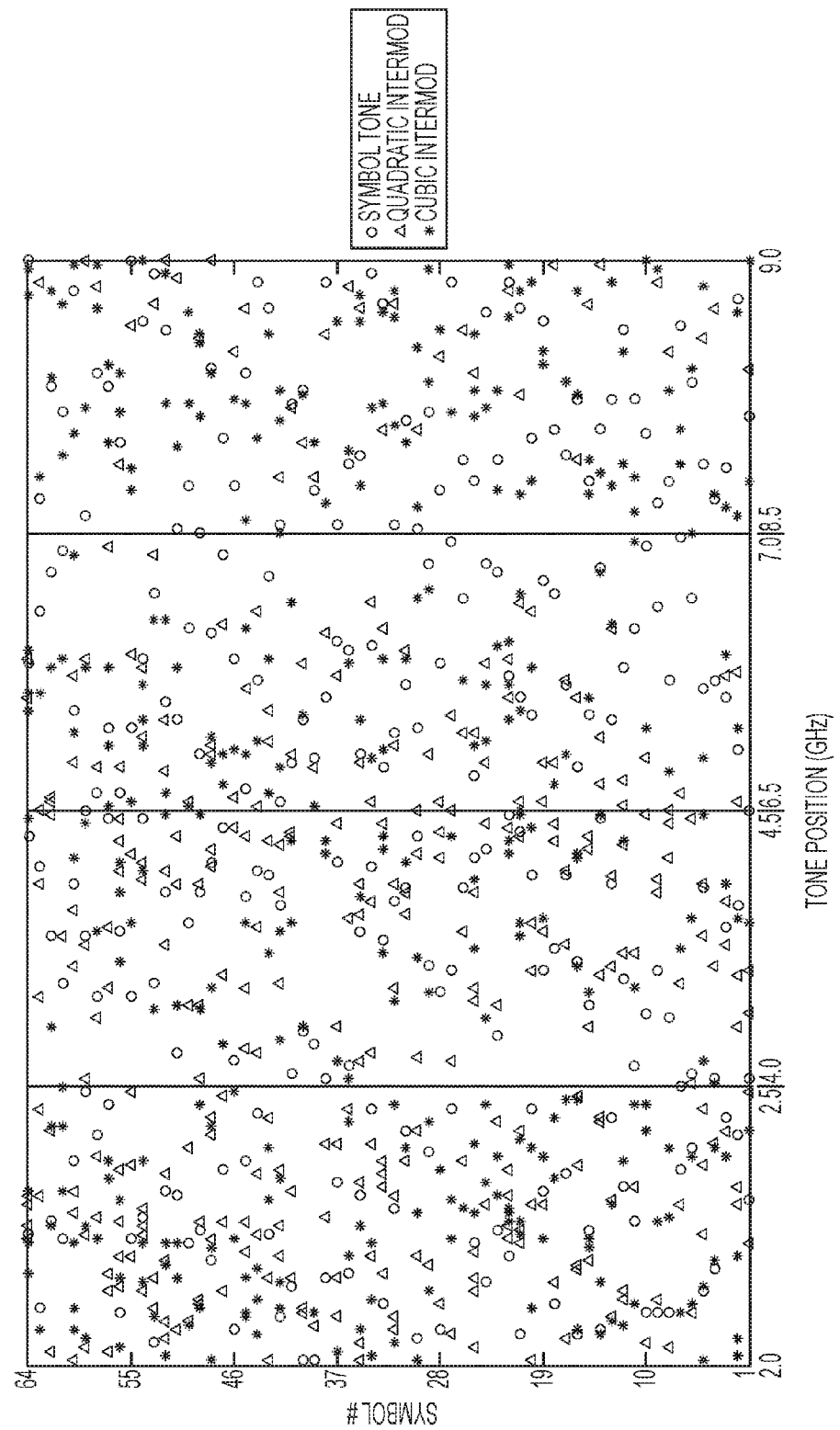

FIG. 3 shows the frequency position modulation spectrum of a modulated transmitted signal when received at the receiver at the transmitted bandwidths $$\frac{BW}{4}.$$

Figure 4:
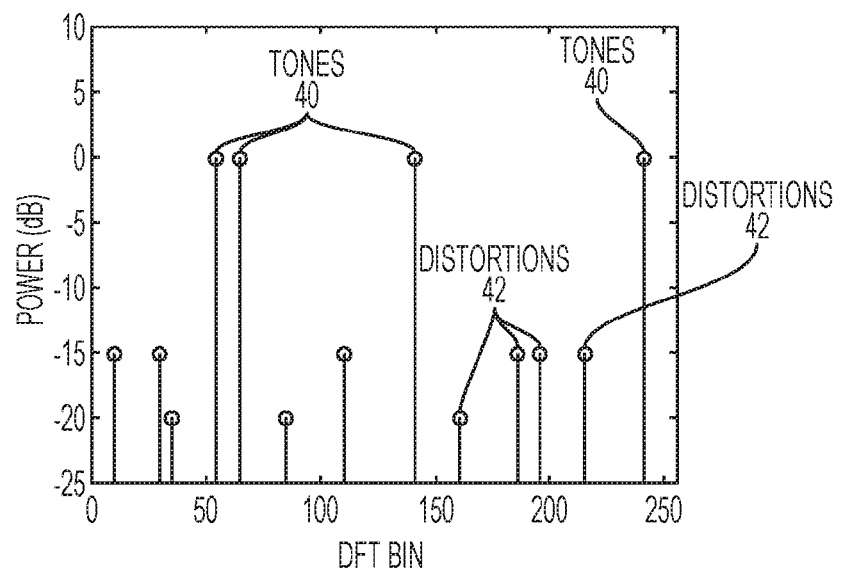

FIG. 4 shows the power level in dB of the FPM spectrum, including the symbol tones and the intermodulation tones generated by the second and third order distortions, respectively.

Figure 5A:
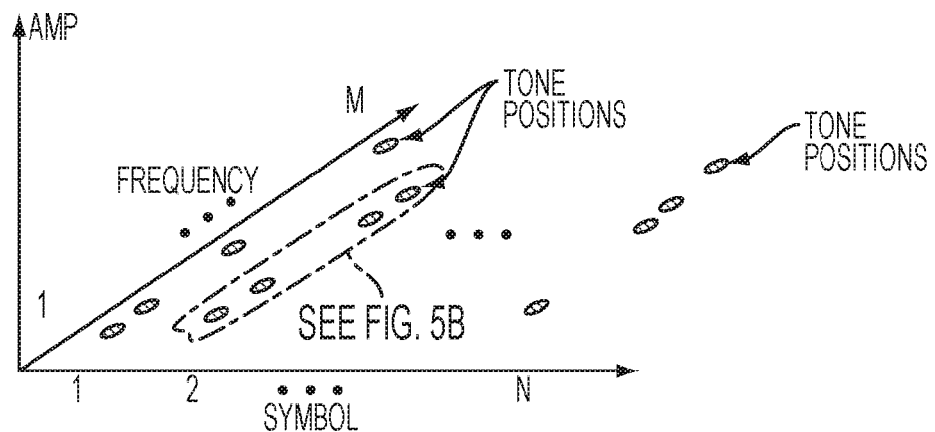
Figure 5B:
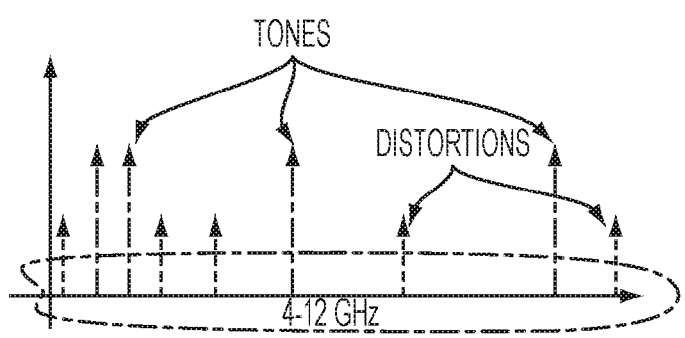

FIG. 5A represents the tone positions of an example FPM constellation with N symbols, and FIG. 5B shows examples amplitudes of the tones and intermodulation terms for one of the symbols in the FPM constellation, over a bandwidth of 4 to 12 GHz.

Figure 6A:
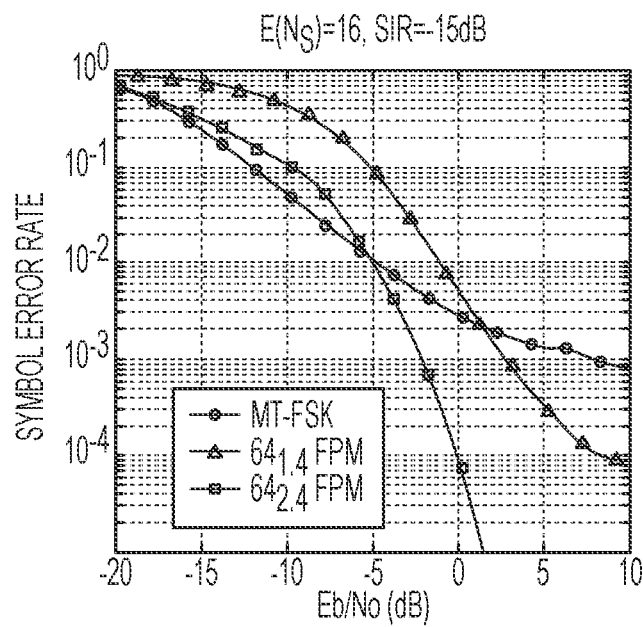
Figure 6B:
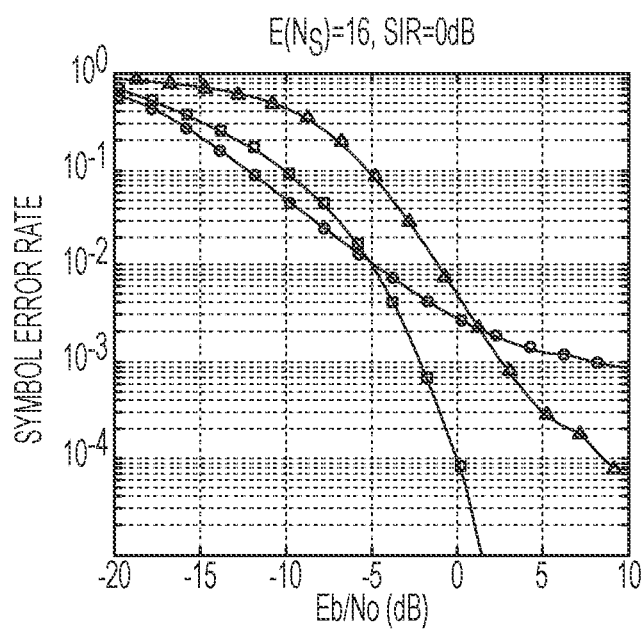

FIGS. 6A and 6B plot the symbol error rate versus $E_b/N_0$ for a simulated frequency position modulation system and a MT-FSK system, under narrow band interference with different SNR values.

FIG. 7A-7E compare the symbol error rate performance of frequency position modulation, multi-tone FSK, and DS-CDMA under varying levels of interference.

FIG. 8A-8D show graphically an example of a FPM constellation of symbols, and various characteristics of the FPM system including data rate, coding, and improvement in symbol gain.

DETAILED DESCRIPTION

Embodiments of the invention are directed to a signal modulation method and system that uses multi-spectral projections (MSPs) to carefully shape and locate tones in frequency, and uses the transmit nonlinearities of RF transmitters to generate nonlinear signal distortions to spread the signal over an ultra-high wideband for transmission. The nonlinearities are generated by driving the power amplifier of the transmitter into saturation to induce distortions at a desired level.

Frequency Position Modulation

The term "Frequency Position Modulation" or "FPM" is used to describe the modulation scheme disclosed herein, in which a signal's discrete frequency support is used to represent symbols. The signal can be non-uniformly spread over many GHz of instantaneous bandwidth, resulting in a communications system that is resilient to interference and difficult to intercept. The FPM symbols are recovered using adaptive projections that use an analog polynomial nonlinearity paired with an analog-to-digital converter that is sampling at a rate at that is only a fraction of the instantaneous bandwidth of the signal. The multi-spectral projections also facilitate using inexpensive commercial off-the-shelf analog to digital converters with uniform-sampling.

Figure 1:
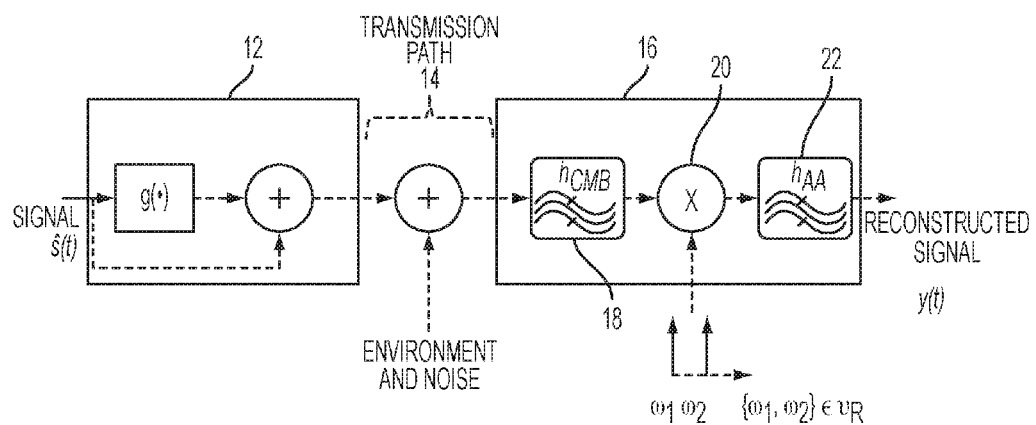
FIG. 1 illustrates a frequency position modulation transmitter in accordance with an embodiment of the invention.

A frequency position modulation symbol is defined by the unique combination of discrete tones that are a part of a larger alphabet. In the presence of partial band interference, nonlinearities generated by the transmitter 12 of FIG. 1 are exploited by the receiver 16 to help unambiguously recover tones that could otherwise be lost. The nonlinearities are generated by driving the power amplifier of the transmitter 12 into saturation to induce distortions at a desired level.

The kth symbol of an FPM alphabet is represented by $I_k$, the frequency support of $$s(t) = \underbrace{\left(\sum_{\omega_m \in U_k} \cos(\omega_m t)\right)}_{\hat{s}(t)} + \sum_{p=1}^{P} g_p(\hat{s}(t)) \quad (1)$$

for $0 \le t < T_s$, where frequencies $\omega_m$ are discrete frequencies drawn from the set $U_T = U_{k=1}^{N_{sym}} U_k$, where $U_T$ is the set of valid $N_{pos}$-tuple frequency positions that define the symbols $U_k$ with cardinality $|U_k| = N_{pos}$.

The FPM bit rate R is $$R = \frac{1}{T_s} \log_2(N_{sym}), \quad (2)$$

with $1/T_s$ being the symbol transmission rate and $N_{sym}$ being the number of unique symbols.

The terms $g_p(\hat{s}(t))$ in equation (1) are nonlinearities generated by the transmitter and are exploited by the receiver to counter interference terms. The nonlinearities $g_p(\hat{s}(t))$ can be written as $$\sum_{p=1}^{P} g_p(\hat{s}(t)) = \qquad (3)$$

$$\sum_{p=1}^{P} \int_{\tau_1} \cdots \int_{\tau_p} h(\tau_1, \ldots, \tau_p) \prod_{i=1}^{p} \hat{s}(t - \tau_i) d\tau_1 \cdots d\tau_p,$$

where $h(\tau_1, \ldots, \tau_p)$ is the multidimensional system response of the transmitter. Spreading the FPM symbols across a very wide instantaneous bandwidth enables the communications system to realize a very large processing gain.

The signal, once frequency-position-modulated according to equation (1), can be transmitted over one or more communication links 14, including the atmosphere, free space, or other media, to the receiver 16. The receiver can recover the symbols using an under-sampling analog-to-digital converter with no loss in signal to noise ratio. The receiver 16 receives the transmitted signal, which has been modulated according to equation (1), then filters 18 and mixes 20 the signal down to baseband according to $$y(t) = \left( (h_{CMB}(t) * s(t)) \underbrace{\sum_{\omega_n \in U_{LO}} \cos(\omega_n t)}_{multi-spectral\ projections} \right) * h_{AA}(t) + n(t) \quad (4)$$

using multiple local oscillator frequencies $\omega_n \in U_{LO}$ with $U_{LO}$ being defined by $$U_{LO} = \bigcup_{i=1}^{\frac{N_{pos}}{2}} \omega_L + \frac{BW}{N_{pos}}(2i-1), \quad (5)$$

where the bandwidth BW is the contiguous bandwidth over which FPM symbols are transmitted, $\omega_L$ is the lowest transmitted frequency within the bandwidth BW, $h_{AA}(t)$ 22 is the anti-aliasing filter that precedes the analog-to-digital converter, and * represents the convolution operator.

In equation (4), multi-spectral projections are defined by the combination of filtering 18 and multi-tone mixing 20 of the incoming spectrum. The noise term n(t) in equation (4) is expected to be Gaussian distributed with a zero mean and a variance $\sigma^2$, and can be written as $N(0, \sigma^2)$. The filtering in the receiver can be accomplished by a comb filter $h_{CMB}(t)$ 18. The Fourier transform of the comb filter $h_{CMB}(t)$ can be defined as $$F(h_{CMB}(t)) = \begin{cases} e^{j\omega d_0} & \text{if } \omega \in U_{CMB} \\ 0 & \text{otherwise} \end{cases} \quad (6)$$

where $U_{CMB}$ is the union of the half open frequency intervals $$U_{CMB} = \bigcup_{i=1}^{N_{pos}} \underbrace{\left[\omega_i + \frac{BW}{N_{pos}^2}(s_i - 1), \omega_i + \frac{BW}{N_{pos}^2} s_i\right)}_{U_{CMB_i}}, \quad (7)$$

and $\omega_i = \omega_L + \frac{BW}{N_{pos}}(i-1)$ with $$\{s_i \in \{1, 2, \ldots, N_{pos}\} : s_i \cap s_j = \{\emptyset\} \forall\, i \neq j\}. \quad (8)$$

The frequency support of $U_{CMB_i}$ is a function of $s_i$ and can be permuted on a symbol-by-symbol basis using a frequency hopping pattern known to both the transmitter and receiver.

A simplified FPM transmitter and receiver is illustrated in FIG. 1, which shows a frequency position modulation system. The signal $\hat{s}(t)$ is frequency position modulated and transmitted by modulator/encoder/transmitter module 12 (the "transmitter") according to equations (1) and (3) above. The modulated signal passes through the transmission path 14 and is received by the receiver/decoder module 16, which reconstructs the signal as y(t) as discussed in the following paragraphs.

Figure 2:
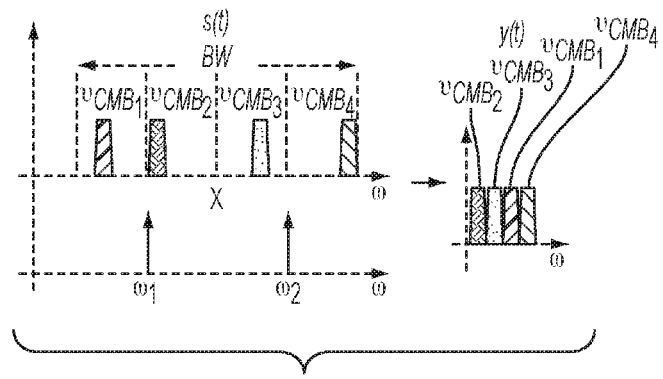
FIG. 2 shows mixing by two tones $\omega_1$ and $\omega_2$ in a receiver/decoder to collapse the wideband spectrum bandwidth BW into $$\frac{BW}{N_{pos}}$$

As seen in FIG. 2, two tones $\omega_1$ and $\omega_2$ are used in the mixing process of the receiver/decoder 16 to collapse the wideband spectrum bandwidth BW into $$\frac{BW}{N_{pos}}.$$

Here, the spectrum bandwidth BW is collapsed into BW/4.

FIG. 3 shows the frequency position modulation spectrum of a modulated transmitted signal when received at the receiver at the transmitted bandwidths $$\frac{BW}{4}.$$

In this example, the tone position is spread across four discrete Fourier transform bins (2.0-2.5 GHz, 4.0-4.5 GHz, 6.5-7.0 GHz, and 8.5-9.0 GHz). The tones include the symbol tones and the intermodulation tones generated by the second and third order distortions.

FIG. 4 shows the power level in dB of the FPM spectrum, including the symbol tones and the intermodulation tones generated by the second and third order distortions, respectively.

The choice of the location of $U_{CMB_i}$ for i=1 to $N_{POS}$ is a matter of system design, within the constraint that equations (7) and (8) must be satisfied. The tones in the set $U_{LO}$ generated at the receiver collapse the FPM symbols spread over bandwidth BW into BW/$N_{POS}$ without the loss in signal to noise ratio or vulnerability to interference suffered by compressed receivers using random linear projections. This is believed to be the result of the filtered multi-spectral projections excluding energy at frequency locations $\omega \notin U_{CMB}$ where the FPM symbols do not have support.

The frequency support of an FPM symbol is divided according to $$\begin{cases} U_k \mid U_k = \bigcup_{i=1}^{N_{pos}} U_{k_i} : U_{k_i} \in U_{CMB_i}, U_{k_i} \subset U_{T_i}, |U_{k_i}| = 1 \end{cases} \text{ and} \quad (9)$$

$$\begin{cases} U_T \mid U_T = \bigcup_{i=1}^{N_{pos}} U_{T_i} : U_{T_i} \in U_{CMB_i} \end{cases}$$

so that the support of each symbol is divided uniformly over the entire frequency range, making the waveform more difficult to intercept and/or detect. If A and $N_{pos}$ are defined as A={1, 2, ..., $N_{pos}$} and $N_{pos} \leq |U_{T_i}|$, and using (9), an $M_{q,N_{pos}}$-ary FPM symbol constellation can be defined to have a number of symbols $N_{sym} = (|U_{T_i}|)^q$ with $|U_{T_i}| = |U_{T_j}|$ for all {{i, j}∈A} subject to equation (9).

Here, q represents the amount of overlap between symbols. Therefore, for q=1, the $M_{1,N_{pos}}$-ary FPM constellation has symbols with mutually exclusive frequency support. Similarly, it is possible to construct an $M_{q,N_{pos}}$-ary FPM constellation that will have symbols with frequency support that overlaps with at most q−1 positions across all other symbols in the constellation. Of particular interest is the $M_{2,N_{pos}}$-ary constellation (with q=2), which has frequency that overlaps with at most one position in each of the other symbols. The comparative data rate when q=2, $$R_q = \frac{1}{T_s} \log_2 M_{q,N_{pos}} = \begin{cases} \frac{1}{T_s} \log_2 |U_{T_i}| & \text{if } q = 1 \\ \frac{1}{T_s} \log_2 |U_{T_i}|^2 & \text{if } q = 2 \end{cases}, \quad (10)$$

is twice that of the q=1 case, although this comes at the expense of resilience to adverse channel conditions. Therefore, an overlap can be selected to provide a desired data rate for a particular application, with an acceptable amount of resilience to adverse channel conditions such as for example, attenuation of high frequencies in a long copper wire, narrowband interference or frequency-selective fading due to multipath.

Consider the example in FIG. 1 and FIG. 2, with a $64_{1,4}$-ary FPM constellations for $i \in 1, 2$. In this case, using equation (10), there are 64 symbols when $i=1$ whose frequency support is orthogonal, and 4096 symbols for $i=2$ where at most one of the four frequency components in one symbol overlaps with any frequency component in any other symbol. In the orthogonal case (q=1), for example, three of the four frequencies in a symbol can be lost to fading without symbol ambiguity, while only two frequencies can be lost without consequence when q=2.

The frequency position modulation system described herein advantageously exploits the transmit nonlinearities of RF transmitters. It is common in RF transmitters to drive amplifiers partially into compression to improve overall transmitter efficiency, however, this can have the undesirable effect of generating nonlinear distortions that can adversely affect demodulation performance or violate the spectral mask requirements of the indigenous spectrum regulatory authority.

In the frequency position modulation system, the transmitter nonlinearities are used to help recover a symbol where there may have been a partial erasure due to fading or ambiguities due to interference. Referring to equation (3), it is seen that the amplifier nonlinearities can generate intermodulation products $g_P(s(t))$, with the 2nd and 3rd order nonlinearities dominating. Consider the case of second order distortions $$g_2(s(t)) = \int_{-\infty}^{\infty} \int_{-\infty}^{\infty} h(\tau_1, \tau_2) \prod_{i=1}^{2} (\cos(\omega_0(t - \tau_i)) + \cos(\omega_1(t - \tau_i))) d\tau_1 \tau_2 \quad (11)$$

$$= |H(\omega_0, \omega_1)| \cos((\omega_0 + \omega_1)t + \angle H(\omega_0, \omega_1)) +$$

$$|H(\omega_0, -\omega_1)| \cos((\omega_0 - \omega_1)t + \angle H(\omega_0, -\omega_1)) +$$

$$\frac{1}{2}|H(\omega_0, \omega_1)| \cos(2\omega_0 t + \angle H(\omega_0, \omega_0)) +$$

$$\frac{1}{2}|H(\omega_1, \omega_1)| \cos(2\omega_1 t + \angle H(\omega_1, \omega_1)),$$

where $$H(\omega_k, \omega_l) = \int_{-\infty}^{\infty} \int_{-\infty}^{\infty} h(\tau_1, \tau_2) e^{-j\omega_k \tau_1} e^{-j\omega_l \tau} 2 d\tau_1 d\tau_2 \quad (12)$$

is the 2D Fourier transform of the transmitter's multi-dimensional system response $h(\tau_1, \tau_2)$, and the terms falling at DC (e.g., $H(\omega_0, -\omega_0)$) in equation (11) are suppressed at the transmitter's output. Each of the distortions terms in equation (11) for $g_2(s(t))$ has an amplitude scaling factor $|H(\cdot)|$ that can be shaped by digital predistortion at the transmitter to a specified value.

Note that third order distortions $g_3(s(t))$ can be written as an extension of equation (11) and each third order distortion's scaling factor, e.g., $|H(\omega_0, \omega_0, -\omega_1)|$, can be shaped by the predistorter.

FIG. 3 illustrates an example of a frequency position modulation $64_{1,4}$-ary FPM constellation with second and third order nonlinearities after digitization at the receiver. Note that $64_{1,4}$-ary FPM constellation is shown, because a $64_{2,4}$-ary constellation is very large (with the number of symbols $N_{SYM}=4096$) and difficult to display on a single page.

The Hamming distance between frequency position modulation symbols is defined as the difference in the number of inter-symbol positions that have energy at different frequencies. The FPM constellations can be chosen to maximize the minimum Hamming distance of the support between symbols in the alphabet. For example, if nonlinearities are not exploited, then the minimum Hamming distance in a $64_{2,4}$-ary constellation is, by definition, 3. Using nonlinearities, the FPM method forms a constellation in which the minimum distance between symbols increases from 3 to 8, with an average minimum Hamming distance of 15.

An example of a symbol with the addition of these nonlinearities, returned to baseband, is illustrated in FIG. 4. FIG. 4 shows a $64_{2,4}$-ary symbol with both intermodulation terms 42 from the second order nonlinearities and the third order nonlinearities. Note that the magnitudes of the distortion terms 42 are somewhat lower than the primary tones 40 in each symbol, in this case 15 dBc and 20 dBc, for second-order distortions ($g_2(s(t))$) and third-order distortions ($g_3(s(t))$), respectively.

FIG. 5A represents the tone positions of an example FPM constellation with N symbols, and FIG. 5B shows examples amplitudes of the tones and intermodulation terms for one of the symbols in the FPM constellation, over a bandwidth of 4 to 13 GHz.

Demodulation of a Frequency Position Modulation Encoded Signal

Demodulation can be accomplished at the receiver by several different demodulation methods, including additive white Gaussian noise (AWGN) demodulation, maximum likelihood (ML) demodulation under Rayleigh fading, and Hamming distance demodulation.

The following analysis discusses maximum likelihood demodulation under additive white Gaussian noise demodulation, maximum likelihood demodulation under Rayleigh fading, and a Hamming distance demodulator under interference conditions. In all three demodulation methods, the received signal in equation (4) is digitized $y(n) \equiv y(nT_s)$ and stacked into an N×1 vector $y=[y_1, y_2, \ldots, y_N]$, and then Fourier transformed with $Y=Wy$, where W is an N×N DFT matrix.

Additive White Gaussian Noise Demodulation

Given a transmitted symbol $S_k$, the receiver receives the transmitted signal plus noise, written as $Y=S_k+N$, where the $N \sim N(0, \sigma^2 I_{N_k})$ is a Gaussian distributed noise vector and $I_{N_k}$ is the $N_k$s$N_k$ identity matrix. Define $I_k$ as the set of indices in Y over which the k th symbol $S_k$ has frequency support, and let $I = \cup_{k=1}^{N_{set}} I_k$. Put $z=[z_1, z_2, \ldots, z_N]$ with $z_i = |Y_i|$, where $Y_i \in Y$ is the i th component of Y and $|\cdot|$ represents the modulus of its complex argument.

A received symbol is interpreted to be the transmitted symbol $S_k$ if, during demodulation, a comparison of likelihood functions yields $$L(z|H_k) > L(z|H_j), \forall k \neq j, \quad (13)$$

where $H_k$ is the hypothesis that $S_k$ was transmitted and $L(\cdot)$ is the likelihood function. The likelihood of a set of received magnitudes in the frequency support of $S_k$ under $H_k$ is a product of Rician likelihood functions, $$\prod_{i \in I_k} \frac{z_i}{\sigma^2} e^{-\frac{1}{2\sigma^2}(z_i^2 + E_{k,i})} I_0\left(\frac{z_{k,i} \sqrt{E_{k,i}}}{\sigma^2}\right) \quad (14)$$

where $E_{k,i}$ is the expected value of the received energy for symbol k at the frequency location i. Also under $H_k$, the likelihood of a set of magnitudes in the received signal at the locations where symbol $S_k$ does not have frequency support is a product of Rayleigh likelihoods, $$\prod_{l \in N_k} \frac{z_l}{\sigma^2} e^{-\frac{z_l^2}{2\sigma^2}}. \tag{15}$$

Using (14) and (15), $L(z|H_k)$ is $$L(z|H_k) = \prod_{i \in I_k} \frac{z_i}{\sigma^2} e^{-\frac{1}{2\sigma^2}(z_i^2 + E_{k,i})} I_0\left(\frac{z_i \sqrt{E_{k,i}}}{\sigma^2}\right) \prod_{l \in N_k} \frac{z_l}{\sigma^2} e^{-\frac{z_l^2}{2\sigma^2}}, \tag{16}$$

and taking the log results in the log-likelihood $$\log(L(z|H_k)) = \sum_{i \in I_k} \log\left(\frac{z_i}{\sigma^2}\right) - \frac{1}{2\sigma^2}(z_i^2 + E_{k,i}) + \log\left(I_0\left(\frac{z_i \sqrt{E_{k,i}}}{\sigma^2}\right)\right) + \sum_{l \in N_k} \log\left(\frac{z_l}{\sigma^2}\right) - \frac{z_l^2}{2\sigma^2}, \tag{17}$$

which, after removing terms common to all hypotheses, simplifies to $$\log(L(z|H_k)) = \sum_{i \in I_k} -\frac{E_{k,i}}{2\sigma^2} + \log\left(I_0\left(\frac{z_i \sqrt{E_{k,i}}}{\sigma^2}\right)\right). \tag{18}$$

Soft decisions can be generated by taking the log-likelihood ratio $$\Lambda_k = \log\left(\frac{L(z|H_k)}{L(z|H_1)}\right) = \sum_{i \in I_k} -\frac{E_{k,i}}{2\sigma^2} + \log\left(I_0\left(\frac{z_i \sqrt{E_{k,i}}}{\sigma^2}\right)\right) + \sum_{j \in I_1} -\frac{E_{1,j}}{2\sigma^2} - \log\left(I_0\left(\frac{z_j \sqrt{E_{1,j}}}{\sigma^2}\right)\right), \tag{19}$$

with respect to a common symbol, in this case $S_1$. Note that approximations $I_0(x) \approx e^x/\sqrt{2\pi x}$ for $x > 3.85$ and $$I_0(x) \approx \sum_{k=0}^{3} \left(\frac{1}{k!}\right)^2 \left(\frac{x}{2}\right)^{2k}$$

for $x < 3.85$ were used in the simulations described below to reduce computational complexity.

Rayleigh Fading Demodulation

Consider $Y = AS_k + N$, where $A = \text{diag}(a_{11}, a_{22}, \ldots, a_{NN}) \in \mathbb{C}^{N \times N}$ is an $N \times N$ diagonal matrix whose elements $a_{ii} \sim N(0, \sigma_R^2)$ are zero-mean Gaussian distributed random variables with variance $\sigma_R^2 I_N$. Now, define $z_i = |Y_i|$ and $\sigma_{k,i}^2 = \sigma_R^2 E_{k,i} + \sigma^2$. Because each observation $z_i$ is a Rayleigh-distributed random variable, the log-likelihood of the series of observations $z$ under $H_k$ is given as $$\log L(z|H_k) = \sum_{i=1}^{N} \left(\log(z_i) - \log(\sigma_{k,i}^2) - \frac{z_i^2}{2\sigma_{k,i}^2}\right) \tag{20}$$

and the log-likelihood ratio follows as $$\Lambda_k = \log\left(\frac{L(z|H_k)}{L(z|H_1)}\right) = \tag{21}$$

$$\sum_{i=1}^{N}\left(-\log(\sigma_{k,i}^2) - \frac{z_i^2}{2\sigma_{k,i}^2}\right) - \sum_{j=1}^{N}\left(-\log(\sigma_{1,j}^2) - \frac{z_j^2}{2\sigma_{1,j}^2}\right)$$

Interference

Maximum likelihood demodulation under additive white Gaussian noise demodulation and maximum likelihood demodulation under Rayleigh fading are not formulated to account for unexpected interference. Specifically, the equations (17) and (20) are versions of a sum-power detector which, when subject to strong interference, can suffer from spurious demodulator decisions.

Hamming Distance Demodulation

As mentioned above, the Hamming distance of the $M_{i,j}$-array FPM constellation can be increased by exploiting nonlinearities of an amplifier. To take advantage of increased Hamming distances, consider a simple frequency support demodulator that tests whether energy above the noise floor is present in each bin $z_i$. The threshold for a given probability of false alarm $P_{FA}$ is $$T = \sqrt{-\sigma^2 \log P_{FA}}, \tag{22}$$

with $$P_D = Q_1(\sqrt{2\text{SNR}}, \sqrt{-2\log P_{FA}}) \tag{23}$$

being the detection probability $P_D$ as a function of SNR (i.e., $E_{k,i}/\sigma^2$), where $Q_1$ is Marcum's Q function. Define $\hat{z}_k = [\hat{z}_{k,1}, \hat{z}_{k,2}, \ldots, \hat{z}_{k,N_k}]$ with $N_k = |I_k|$ where $$\hat{z}_{k,i} = \begin{cases} 1 & \text{if } z_i > T, \text{ for } i \in I_k \\ 0 & \text{otherwise} \end{cases}, \tag{24}$$

and select a threshold T to achieve the desired $P_{FA}$ and $P_D$. Then $H_k$ is the demodulation result if $$\frac{\|\hat{z}_k\|_0}{\|S_k\|_0} > \frac{\|\hat{z}_j\|_0}{\|S_j\|_0}, \forall k \neq j, \tag{25}$$

where $\|\cdot\|_0$ indicates the $L_0$ pseudo-norm, which returns the number of non-zero elements in a vector. Note that equations (17) or (20) can be used to break any ties that may occur using equation (26).

Example showing Numerical Performance of a Frequency Position Modulation System

A communications system was simulated using $64_{1,4}$- and $64_{2,4}$-ary FPM and the system's symbol error rate (SER) performance was compared to that of DS-CDMA and MT-FSK. The MT-FSK performance was measured using the same symbol constellation as FPM but without distortions and compressed into a 2 GHz transmit bandwidth. The performance of each of the waveforms was measured under frequency-selective Rayleigh fading. The simulations were performed with and without the communications systems being subject to narrow-band interference. The interference sources occupied up to 8 MHz of instantaneous bandwidth, and there were $N_s$ interference sources randomly distributed during each symbol period where $N_s$ is a binomial random variable with expectation $E\{N_s\}=4$ or $E\{N_s\}=16$. The power of the interferers was measured with a signal-to-interference ratio (SIR) as the total signal power compared to the power of a single interference source.

FIGS. 6A and 6B plot the symbol error rate (SER) versus $E_b/N_0$ for a simulated frequency position modulation system and for a DS-CDMA and MT-FSK, under narrow band interference with −15 dB SNR (FIG. 6A) or 0 dB SNR (FIG. 6B). In this case the interference was constrained to 2 GHz of instantaneous bandwidth. $E_b/N_0$ is the energy per bit noise power spectral density ratio, where $N_0$ is the noise spectral density, and $E_b$ is the energy per bit.

Figure 7A:
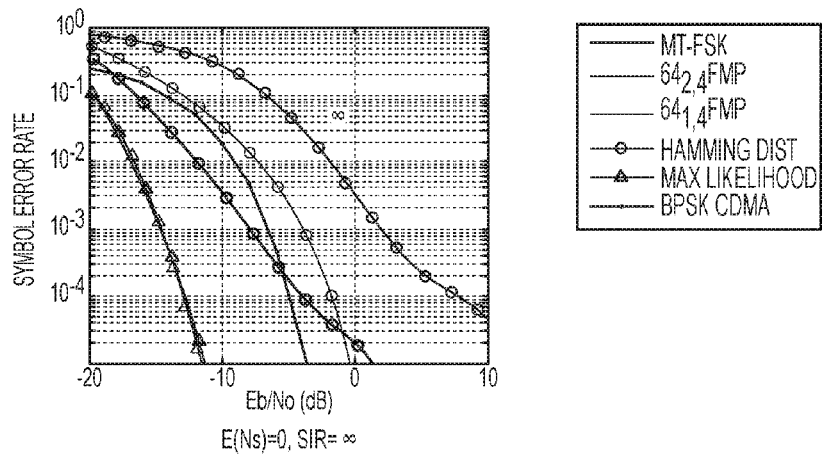
Figure 7B:
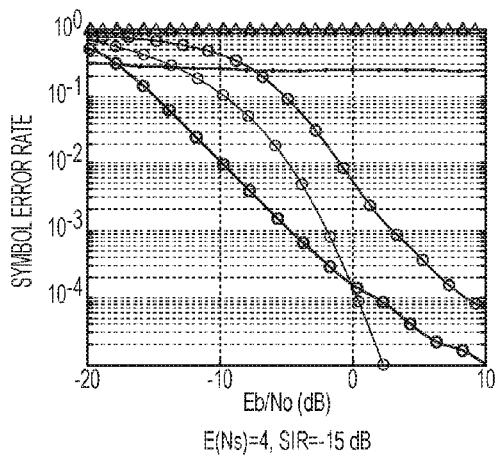
Figure 7C:
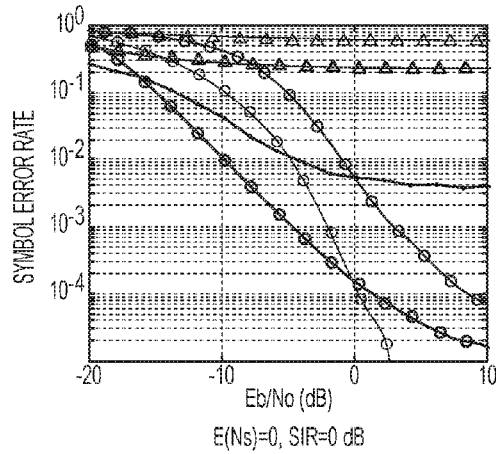
Figure 7D:
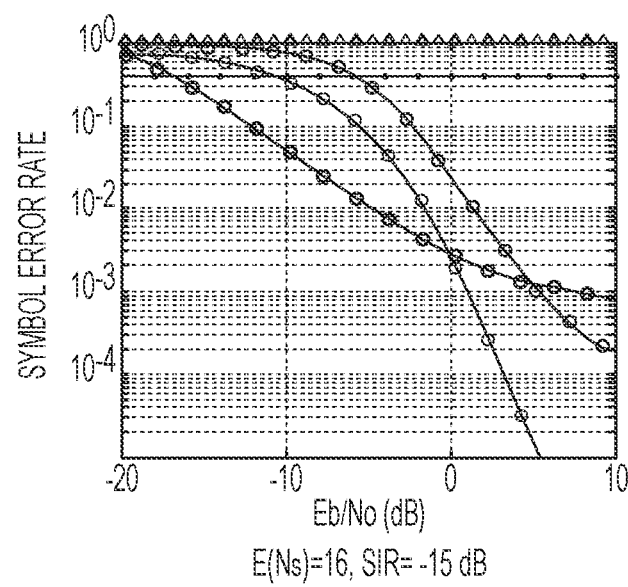
Figure 7E:
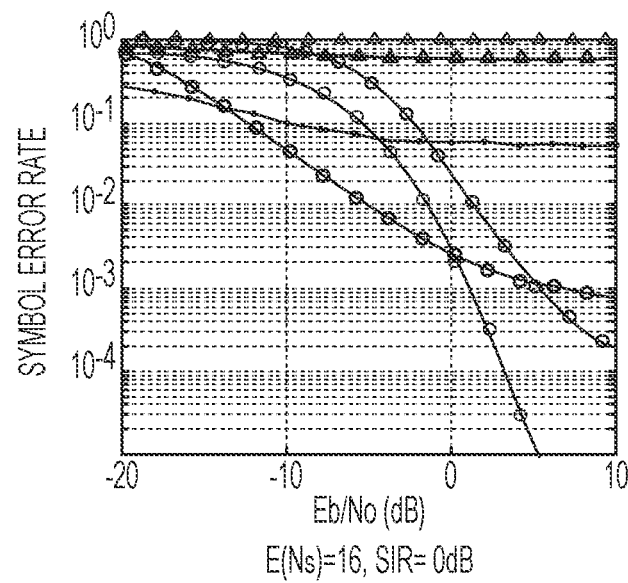

FIG. 7A-7E compare the symbol error rate performance of frequency position modulation, multi-tone FSK, and DS-CDMA under varying levels of interference. FIG. 7A shows the SER performance with no interference. FIG. 7B shows the SER performance with randomly distributed interference with mean four interferors at SIR=−15 dB. FIG. 7C shows the SER performance with randomly distributed interference with mean four interferors at SIR=0 dB. FIG. 5D shows the SER performance with randomly distributed interference with mean sixteen interferors at SIR=−15 dB. FIG. 5E shows the SER performance with randomly distributed interference with mean sixteen interferors at SIR=0 dB. The FPM and MT-FSK systems were simulated under frequency-selective Rayleigh fading and AWGN, while the DS-CDMA system was simulated under AWGN only.

The symbols in the FPM cases were transmitted in 8 GHz of instantaneous bandwidth (IBW), and MT-FSK in 2 GHz of IBW. Both were digitized at a 4 GHz rate at the receiver with varying amounts of interference described above. After digitization a 512-point FFT was taken, and the ML ratios in equations (17)-(20) and Hamming distance detectors of equation (24) were individually used for FPM and MT-FSK demodulation. The data rates for the $64_{1,4}$-ary and $64_{2,4}$-ary FPM constellations were roughly 47 and 94 Mbps, respectively. The DS-CDMA system was simulated with information rate of 94 Mbps and spread over two GHz of bandwidth. This enables a direct comparison with $64_{2,4}$-ary FPM under various interference conditions for the same fixed data rate, although it may be impractical to spread DS-CDMA over two GHz. The performance of FPM, MT-FSK, and DS-CDMA under different levels of interference is illustrated in FIG. 7A-7E. Note that the processing gain of FPM is roughly 24 dB with a commensurate data rate of 94 Mbps. For a comparable DS-CDMA system using BPSK modulation with an information bandwidth of 2 GHz and data rate of 94 Mbps, the processing gain is only 13.2 dB.

When no interference is present, the ML detector performs equally well for both FPM and MT-FSK. As expected, the ML detector degrades catastrophically in the presence of even minimal interference. With low interference (SIR=0 dB), DS-CDMA performs best when fewer interference sources are present, but with $E\{N_s\}=16$ interference becomes significant and FPM outperforms both MT-FSK and DS-CDMA when using the Hamming distance detector. With moderate interference (SIR=−15 dB), FPM outperforms DS-CDMA, although MT-FSK can be briefly superior for lower SNR values. At low SNR, interference can easily be mistaken for nonlinearities, leading the FPM demodulator to make unreliable decisions (more so than the MT-FSK demodulator, which considers a smaller support because it neglects the distortions). If the FPM demodulator were to ignore distortions at low SNR, the performance gap between FPM and MT-FSK at very low SNR would close. The $64_{1,4}$-ary FPM constellation had consistently lower symbol error rates than the $64_{2,4}$-ary FPM constellation using the Hamming distance demodulator, which is expected because the support of individual symbols is more distinct and therefore symbol errors are less likely to occur. However, the $64_{2,4}$-ary FPM constellation can double the data rate for an extra 3-6 dB energy per bit, making it an attractive modulation for a communications system.

Note that the current definition of the Hamming distance detector considers nonlinearities at the same level as the basic frequencies. This is clearly sub-optimal for FPM, given the greater strength of the basic tones. A modification to the energy thresholds or a weighting of the pseudo-norm used to accumulate the observations would presumably bring the performance of the FPM demodulator more in-line with the MT-FSK demodulator at lower SNRs, where the MT-FSK demodulator is currently superior. With the appropriate construction, the performance of FPM may match or exceed MT-FSK, even at these lower SNRs.

In the presence of interference confined to an instantaneous bandwidth of 2 GHz, FPM significantly outperformed MT-FSK given that FPM could spread its energy over 4 times the bandwidth. The relative performance of FPM and MT-FSK in the narrowband interference case is illustrated in FIG. 4 for two SIR levels, 0 dB and −15 dB SIR, which demonstrates the beneficial impact of wideband operation on SER performance Note that in the narrowband interference case both FPM and MT-FSK used a frequency support detector for demodulation.

FPM Comparison to MT-FSK

FPM and MT-FSK share some common features as well as exhibit some significant differences. Like MT-FSK, frequency position modulation uses the absolute position in frequency to define symbols. However, unlike MT-FSK, FPM is able to operate over an extended bandwidth by using multi-spectral projections on receive to collapse a wide-band signal into a lower dimensional subspace so that an under-sampling (with respect to the transmit bandwidth) analog to digital conversion can recover the transmitted signal. This extended bandwidth is beneficial in that FPM suffers less from interference resulting from the existence of densely-populated bands within the transmit bandwidth, as it will only coincide with those bands in a limited portion of transmissions. Further, FPM exploits transmit nonlinearities to help recover the transmitted signal during demodulation that might otherwise be lost in the presence of interference. Finally, the FPM constellation—which takes into account multi-spectral projections—and the size of the $M_{q,N_{pos}}$-ary FPM alphabet grows at a rate exponentiated by q, which determines the number of overlapping frequency positions in each of the FPM symbols. The performance comparison of MT-FSK and FPM is as described in the paragraphs above, and as shown in FIG. 6A-6B and FIG. 7A-7E.

A low probability of intercept/low probability of detection LPI/LPD communications system in accordance with embodiments of the invention uses a Frequency Position Modulation (FPM) capable of operating over extremely wide bandwidths at very low SNRs and in the presence of strong interference. FPM leverages adaptive multi-spectral projections to enable robust signal recovery using COTS hardware and sub-Nyquist rate sampling. Further, exploiting transmitter nonlinearities at the receiver enables robust signal recovery in interference laden conditions where conventional communications systems would be likely to fail. The FPM performance can be better than several common LPI/LPD communications systems, such as MT-FSK and standard spread spectrum systems (DS-CDMA). The FPM offers roughly an order of magnitude increase in processing gain over CDMA for a fixed data rate and has resilience in the presence of fading and interference.

Figure 8A:
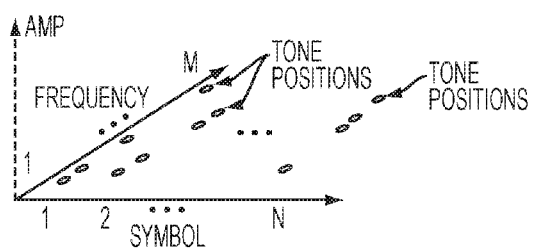
Figure 8B:
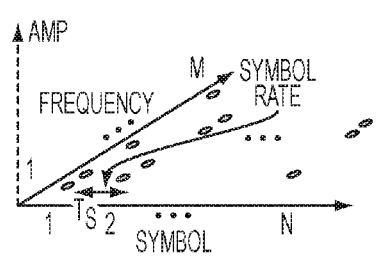
Figure 8C:
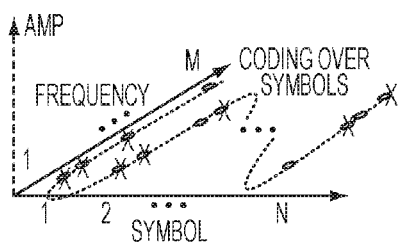
Figure 8D:
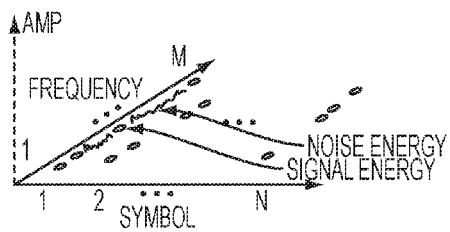

FIG. 8A shows an example of a FPM constellation. FIG. 8B shows that the FPM method can provide a data rate of up to M log$_2$ (N/T$_s$), with T$_s$ being the symbol rate. FIG. 8C illustrates coding over the symbols in a constellation. The method provides an up to N-fold improvement in symbol gain, thus demonstrating robustness to symbol deletions. FIG. 8D illustrates noise energy superimposed over the FPM constellation. The FPM system can provide a K-M fold improvement in SNR, when demodulated in the frequency domain, with 2K being the DFT or FFT length.

As mentioned above, the multi-spectral projections also facilitate using inexpensive commercial off-the-shelf analog to digital converters (ADCs) with uniform-sampling. In contrast, the ADCS that use random linear projections by random sampling typically require a full Nyquist rate sample-and-hold.

The frequency position modulation system and method is believed to provide an order of magnitude improvement in processing gain over conventional LPI/LPD communications (e.g., CDMA) and can facilitate the ability to operate in interference-laden environments where conventional compressed sensing receivers could fail.

What is claimed as new and desired to be protected by Letters Patent of the United States is:

1. A method for modulating a digital signal for transmission, comprising:
    generating a plurality of tones, each tone being centered at a different frequency,
    generating at least second and third order intermodulation terms by driving the plurality of tones through a power amplifier at a power level that drives the power amplifier into saturation,
    said tones and said second and third order intermodulation terms being the elements of a frequency position modulation constellation having a plurality of symbols, each symbol comprising said tones and said second and third order intermodulation terms, such that the positions of each of the tones and their associated second and third order intermodulation terms form the symbols of the constellation, with a Hamming distance across the frequency position modulation constellation being greater than the number of tones.

2. A method according to claim 1, wherein each of the plurality of tones is centered at a different frequency above 2 gigahertz.

3. A method according to claim 1, further comprising:
    transmitting the tones and said second and third order intermodulation terms through free space or atmosphere.

4. A method for modulating a digital signal for transmission, comprising:
    generating a plurality of tones, each tone being centered at a different frequency;
    generating at least second and third order intermodulation terms by driving the plurality of tones through a power amplifier at a power level that drives the power amplifier into saturation, said tones and said second and third order intermodulation terms being the elements of a frequency position modulation constellation, and receiving the signal, filtering and mixing the signal down to baseband according to $$y(t) = \left[ (h_{CMB}(t) * s(t)) \sum_{\omega_n \in U_{LO}} \cos(\omega_n t) \right] * h_{AA}(t) + n(t)$$

using local oscillator frequencies $\omega_n \in U_{LO}$ with $U_{LO}$ being defined by $$U_{LO} = \bigcup_{i=1}^{\frac{N_{pos}}{2}} \omega_L + \frac{BW}{N_{pos}}(2i-1),$$

where BW is the contiguous bandwidth over which frequency position modulation symbols are transmitted, $N_{pos}$ is the number of tones in one of the frequency position modulation symbols, $\omega_L$ is the lowest transmitted frequency within the bandwidth BW, $h_{AA}(t)$ represents an anti-aliasing filter, * represents the convolution operator, y(t) is a reconstructed signal, s(t) is the symbol to be transmitted, $h_{CMB}(t)$ represents a comb filter, $\omega_N$ is an n$^{th}$ local oscillator frequency within the set of $U_{LO}$ local oscillator frequencies, and n(t) is a noise term representing receiver noise; and
    demodulating the received signal with at least one of additive white Gaussian noise (AWGN) demodulation, maximum likelihood (ML) demodulation under Rayleigh fading, and Hamming distance demodulation.

5. A transmitter for modulating a digital signal for transmission and for transmitting the signal, comprising:
    a tone generation module adapted to generate a plurality of tones, each tone being centered at a different frequency; and
    a power amplifier configured to transmit and amplify the tones,
    wherein in operation, at least second and third order intermodulation terms are generated by first applying a digital nonlinear transform and then driving the plurality of tones through the power amplifier at a power level that drives the power amplifier into saturation,
    said tones and said second and third order intermodulation terms being the elements of a frequency position modulation constellation having a plurality of symbols, each symbol comprising said tones and said second and third order intermodulation terms, such that the positions of each of the tones and their associated second and third order intermodulation terms form the symbols of the constellation, with a Hamming distance across the frequency position modulation constellation being greater than the number of tones.

6. A transmitter according to claim 5, wherein each of the plurality of tones is centered at a different frequency above 2 gigahertz.

7. A transmitter according to claim 5, further comprising:
    transmitting the tones and said second and third order intermodulation terms through free space or atmosphere.

8. A transmitter and receiver system, comprising:
    a transmitter for modulating a digital signal for transmission and for transmitting the signal, including
        a tone generation module adapted to generate a plurality of tones, each tone being centered at a different frequency, and a power amplifier configured to transmit and amplify the tones, wherein in operation, at least second and third order intermodulation terms are generated by first applying a digital nonlinear transform and then driving the plurality of tones through the power amplifier at a power level that drives the power amplifier into saturation, said tones and said second and third order intermodulation terms being the elements of a frequency position modulation constellation; and a receiver configured to receive and demodulate the transmitted signal, wherein in operation, the receiver receives the transmitted signal, and filters and mixes the transmitted signal down to baseband according to $$y(t) = \left[ (h_{CMB}(t) * s(t)) \sum_{\omega_n \in U_{LO}} \cos(\omega_n t) \right] * h_{AA}(t) + n(t)$$

using multiple local oscillator frequencies $\omega_n \in U_{LO}$ with $U_{LO}$ being defined by $$U_{LO} = \bigcup_{i=1}^{\frac{N_{pos}}{2}} \omega_L + \frac{BW}{N_{pos}}(2i-1),$$

where the bandwidth BW is the contiguous bandwidth over which FPM symbols are transmitted, $\omega_L$ is the lowest transmitted frequency within the bandwidth BW, $h_{AA}(t)$ is an anti-aliasing filter that precedes an analog-to-digital converter, and * represents the convolution operator, and wherein the frequency support of $U_{CMBi}$ is a function of $s_i$ and is permuted on a symbol-by-symbol basis using a frequency hopping pattern known to both the transmitter and receiver.

* * * * *